(12) United States Patent
Lee et al.

(10) Patent No.: US 8,061,024 B2
(45) Date of Patent: Nov. 22, 2011

(54) METHOD OF FABRICATING A CIRCUIT BOARD AND SEMICONDUCTOR PACKAGE.

(75) Inventors: Jong-Joo Lee, Gyeonggi-do (KR);
Soon-Yong Hur, Gyeonggi-do (KR)

(73) Assignee: Samsung Electronics Co., Ltd.,
Maetan-dong, Yeongtong-gu, Suwon-si, Gyeonggi-do (KR)

( * ) Notice: Subject to any disclaimer, the term of this patent is extended or adjusted under 35 U.S.C. 154(b) by 736 days.

(21) Appl. No.: 12/126,364

(22) Filed: May 23, 2008

(65) Prior Publication Data

US 2008/0289177 A1     Nov. 27, 2008

(30) Foreign Application Priority Data

May 25, 2007  (KR) .................. 10-2007-0051077

(51) Int. Cl.
*H05K 3/02* (2006.01)
(52) U.S. Cl. ............... 29/846; 29/830; 29/847; 29/852
(58) Field of Classification Search .............. 29/830, 29/832, 840, 841, 846, 847, 852
See application file for complete search history.

(56) References Cited

U.S. PATENT DOCUMENTS

| | | | | |
|---|---|---|---|---|
| 4,775,573 | A | * | 10/1988 | Turek ........................ 428/209 |
| 4,854,040 | A | * | 8/1989 | Turek ............................ 29/847 |
| 6,753,480 | B2 | * | 6/2004 | Maa et al. ..................... 174/255 |
| 6,933,448 | B2 | * | 8/2005 | Maa et al. ..................... 174/255 |

FOREIGN PATENT DOCUMENTS

| | | |
|---|---|---|
| JP | 2001-148444 | 5/2001 |
| KR | 2004-0110531 | 12/2004 |
| KR | 2006-0108045 | 10/2006 |

OTHER PUBLICATIONS

English language abstract of Japanese Publication No. 2001-148444.
English language abstract of Korean Publication No. 2004-0110531.
English language abstract of Korean Publication No. 2006-0108045.

* cited by examiner

*Primary Examiner* — Carl Arbes
(74) *Attorney, Agent, or Firm* — Muir Patent Consulting, PLLC

(57) ABSTRACT

Provided are a circuit board, a semiconductor package including the circuit board, a method of fabricating the circuit board, and a method of fabricating the semiconductor package. The method of fabricating the circuit board includes: forming at least one pair of rows of first bonding pads arranged on a base substrate in a first direction, and a first central plating line formed between the rows of first bonding pads to commonly connect with the rows of first bonding pads; forming an electroplating layer on the first bonding pads; and exposing the base substrate by removing the first central plating line.

20 Claims, 9 Drawing Sheets

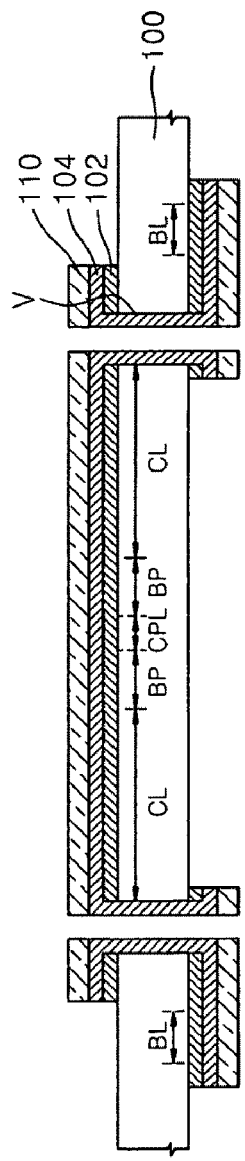
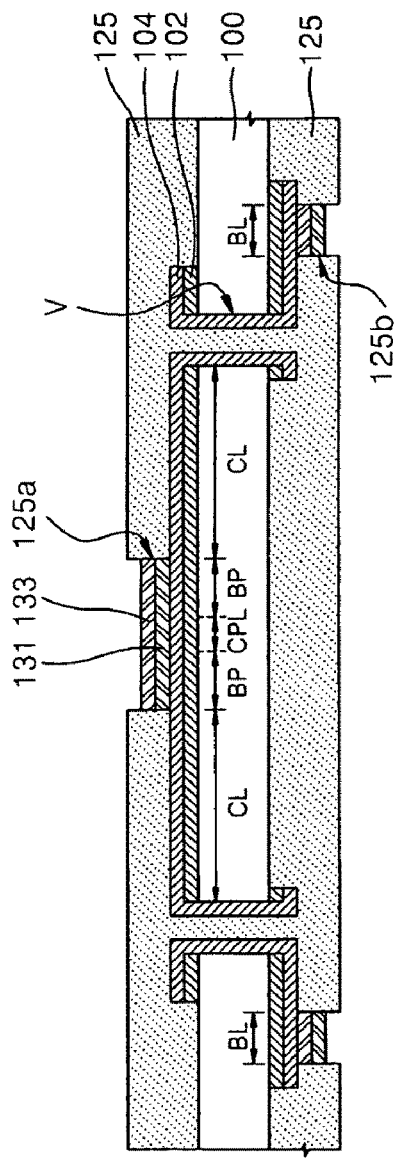

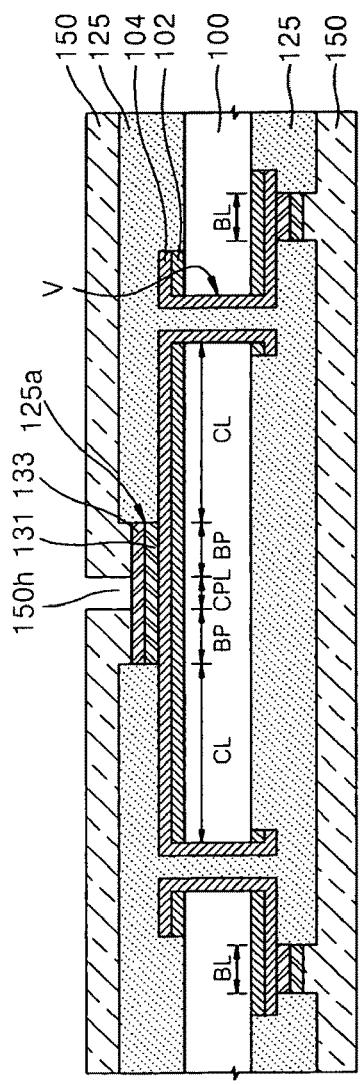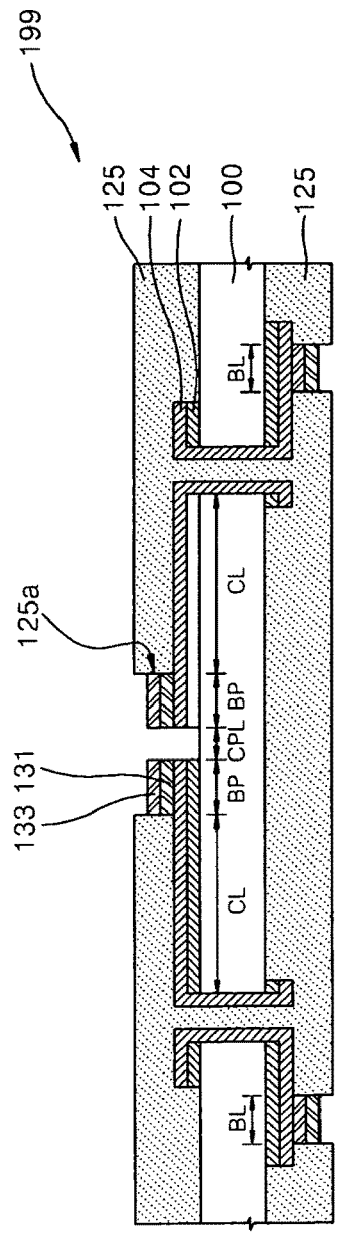

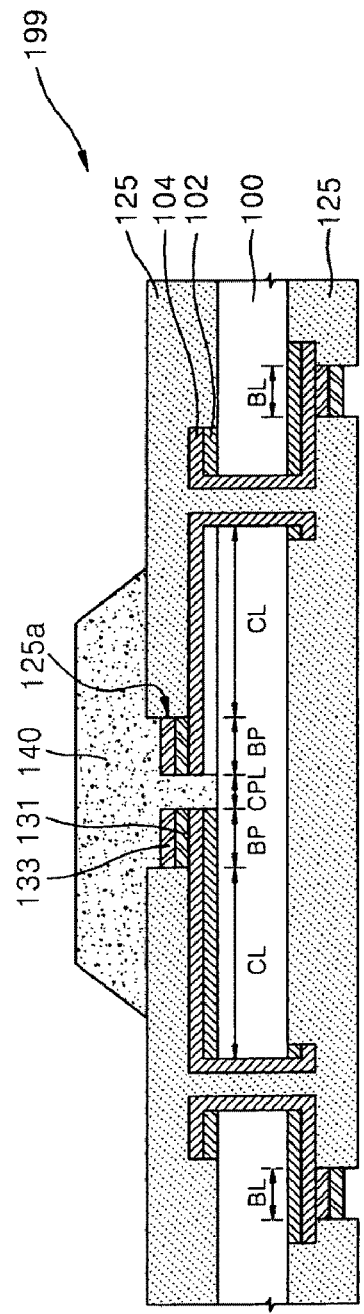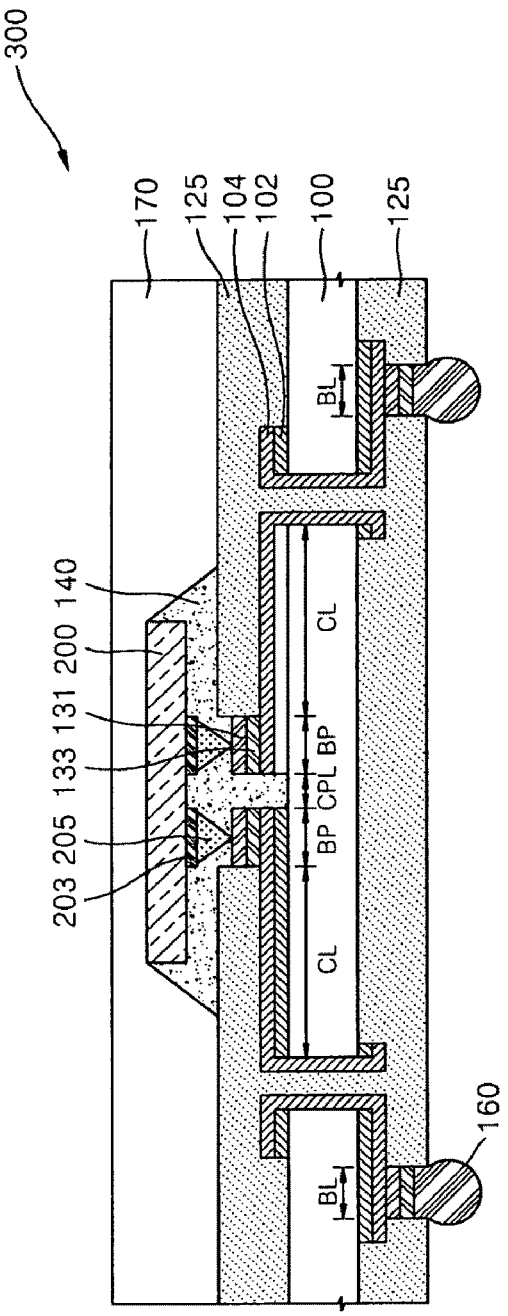

METHOD OF FABRICATING A CIRCUIT BOARD AND SEMICONDUCTOR PACKAGE.

CROSS-REFERENCE TO RELATED PATENT APPLICATION

This application claims priority under 35 USC §119 to Korean Patent Application No. 10-2007-0051077, filed on May 25, 2007 in the Korean Intellectual Property Office, the disclosure of which is incorporated herein in its entirety by reference.

BACKGROUND

1. Technical Field

This disclosure relates to a circuit board, a semiconductor package comprising the circuit board, and methods of fabricating the circuit board and the semiconductor package. More particularly, this disclosure relates to a circuit board including bonding pads for flip chip bonding, a semiconductor package comprising the circuit board, and methods of fabricating the circuit board and the semiconductor package.

2. Description of the Related Art

As the operational speed of integrated circuit chips and the number of input and output pins are increasing, conventional wire bonding technology has reached its limit. Accordingly, to replace the wire bonding technology, flip chip technology is being developed. In the flip chip technology, conductive studs are formed on chip pads of a semiconductor chip and the semiconductor chip is mounted on a circuit board using the conductive studs. Specifically, the conductive studs are electrically connected to bonding pads formed on the circuit board, respectively.

In the flip chip technology, in order to electrically connect the conductive studs to the bonding pads reliably, a very thick, high quality metal finish layer may preferably be formed on the bonding pads. The metal finish layer can be formed using an electroless plating method or an electroplating method. However, the electroless plating method is generally not used because the expense of forming the thick metal finish layer using the electroless plating method is comparatively high.

Accordingly, the metal finish layer is typically formed by using an electroplating method, and in this case, a plating line that is electrically connected to all of the bonding pads needs to be formed.

However, after the semiconductor package is completed, the plating line may operate as an electrically open stub toward a path through which electrical signals are transmitted, and may thereby distort the signals being transmitted.

SUMMARY

The present invention provides a circuit board including bonding pads that do not distort signals being transmitted and that provide reliable connection with conductive studs, a semiconductor package including the circuit board, and methods of fabricating the circuit board and the semiconductor package.

According to an aspect of the present invention, there is provided a method of fabricating a circuit board. At least one pair of rows of first bonding pads arranged in a first direction and a first central plating line formed between the rows of first bonding pads to electrically connect to the rows of first bonding pads are formed on a base substrate. An electroplating layer on the first bonding pads is formed. The base substrate is exposed by removing the first central plating line.

BRIEF DESCRIPTION OF THE DRAWINGS

The above and other features and advantages of the present invention will become more apparent by describing in detail exemplary embodiments thereof with reference to the attached drawings in which:

FIGS. 3A through 3G are cross-sectional views sequentially illustrating a method of fabricating the circuit board of FIG. 1D;

FIGS. 3H through 3I are cross-sectional views sequentially illustrating a method of fabricating a semiconductor package including the circuit board of FIG. 1D, according to an embodiment of the present invention;

DETAILED DESCRIPTION

Figure 1A:
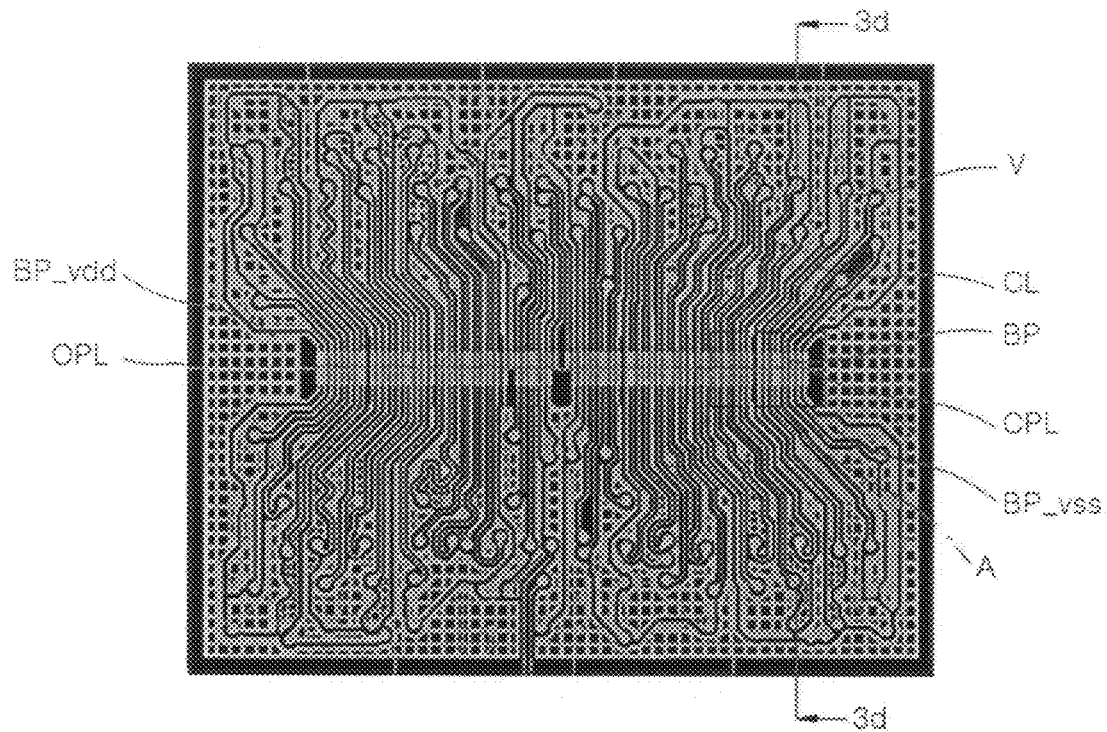
FIGS. 1A through 1D are plan views sequentially illustrating a method of fabricating a circuit board, according to an embodiment of the present invention.

Embodiments of the present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to one skilled in the art. In the drawings, the thicknesses of layers and regions are exaggerated for clarity. Like reference numerals denote like elements throughout the specification.

Figure 1B:
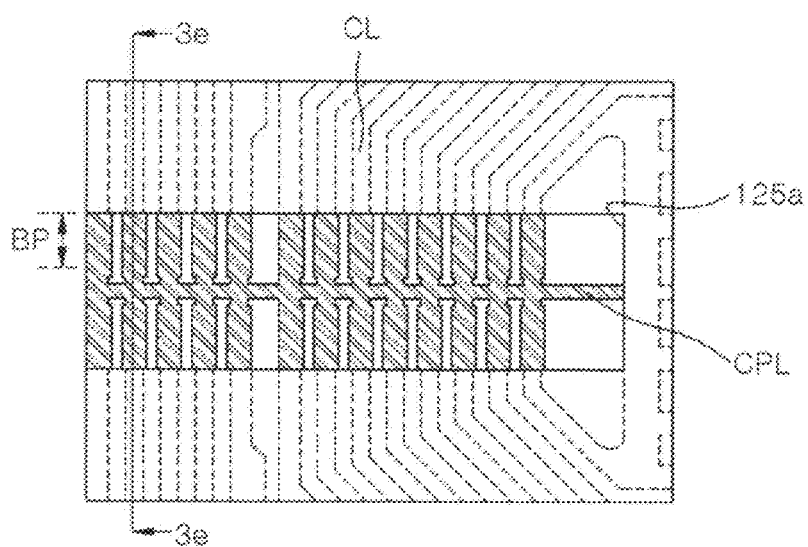

FIGS. 1A through 1D are plan views sequentially illustrating a method of fabricating a circuit board, according to an embodiment of the present invention. FIG. 1B is an expanded view of a portion A of FIG. 1A.

FIGS. 3A through 3G are cross-sectional views sequentially illustrating the method of fabricating the circuit board.

Figure 1C:
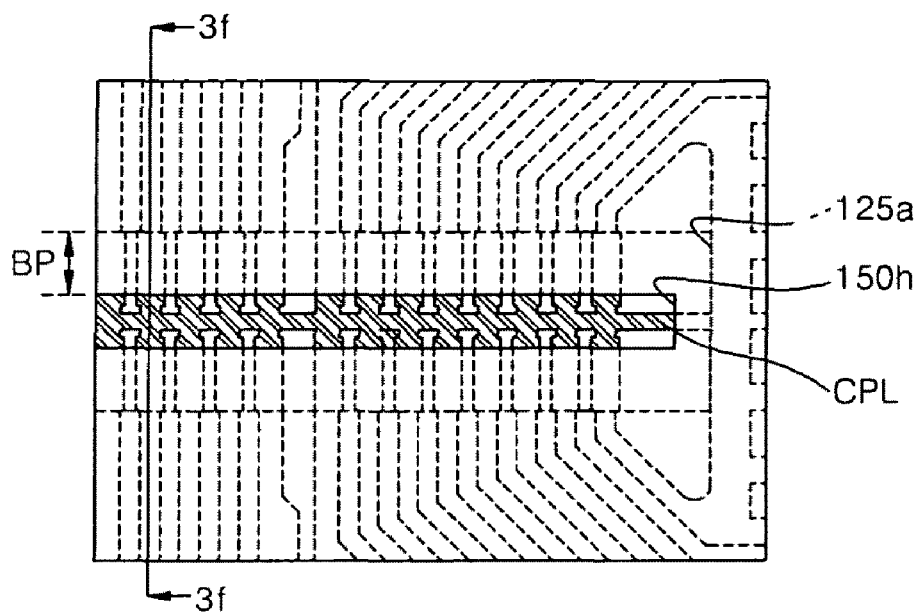
Figure 1D:
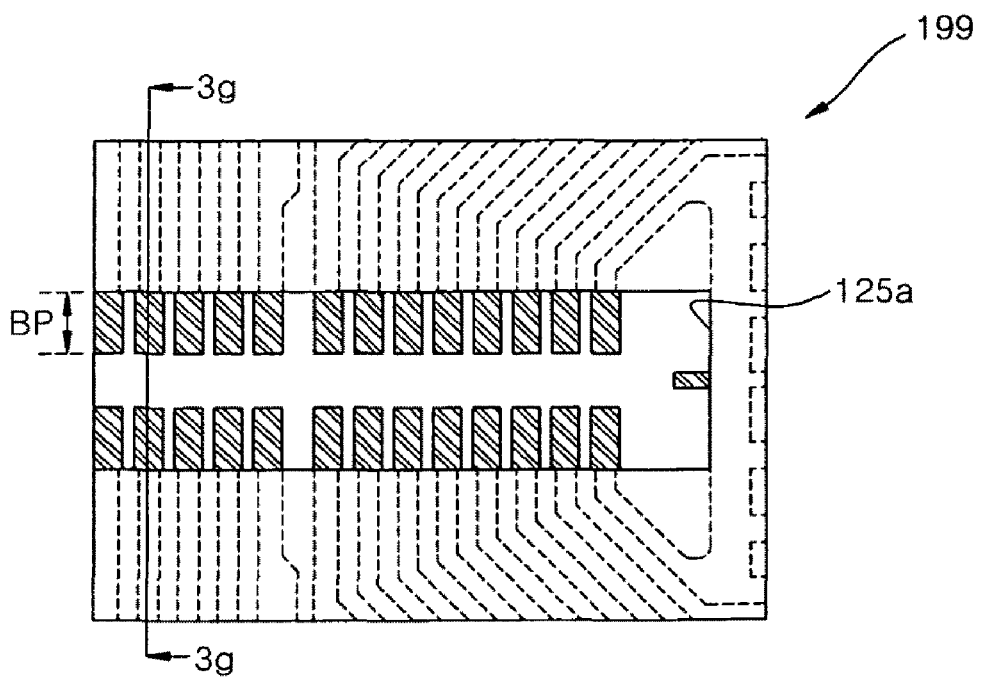

FIGS. 3H through 3I are cross-sectional views sequentially illustrating a method of fabricating a semiconductor package including the circuit board of FIG. 1D, according to an embodiment of the present invention.

In detail, FIGS. 3D through 3G are cross-sectional views taken along lines 3d-3d, 3e-3e, 3f-3f, and 3g-3g of FIGS. 1A, 1B, 1C, and 1D, respectively.

Figure 3A:
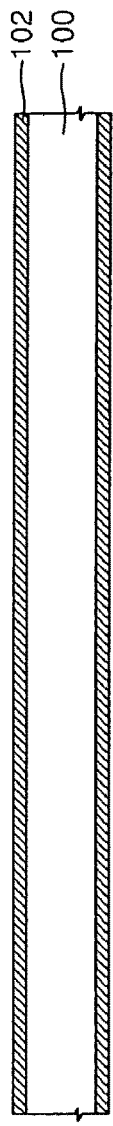

Referring to FIG. 3A, a conductive layer laminate including a base substrate 100 and first conductive layers 102 formed on both sides of the base substrate 100 is provided. The conductive layer laminate may be a copper clad laminate (CCL) including a copper layer as the first conductive layers 102.

Figure 3B:
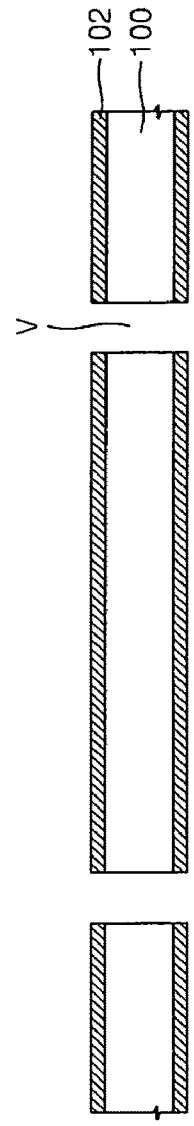

Referring to FIG. 3B, a via hole V is formed in the base substrate 100 and the first conductive layers 102 so as to pass completely through the base substrate 100 and the first conductive layers 102.

Figure 3C:
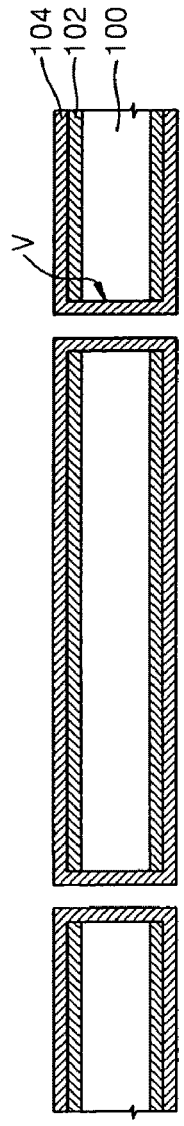

Referring to FIG. 3C, a second conductive layer 104 is formed on the first conductive layers 102 and on sidewalls of the via hole V. The second conductive layer 104 may be a layer containing copper, nickel, gold, or an alloy thereof.

Referring to FIG. 3D, a photoresist film (not shown) is stacked on the base substrate 100 including the second conductive layer 104. The photoresist film is then exposed and developed to form a photoresist pattern 110 exposing a portion of the second conductive layer 104. By using the photoresist pattern 110 as a mask, the exposed second conductive layer 104 and the first conductive layers 102 are etched to obtain the resultant structure of FIG. 3D.

As a result of the method described above and as illustrated in FIG. 1A, wirings are formed on the base substrate 100. In detail, at least one pair of rows of bonding pads BP, circuit lines CL respectively connected to first sides of the bonding pads BP, a central plating line CPL connected to a second side of the bonding pads BP, and an outer plating line OPL connected to the central plating line CPL are formed.

The rows of bonding pads BP extend in a first direction of the base substrate 100. The first direction may be a horizontal direction. Also, the rows of bonding pads BP may be densely formed in substantially the center region of the base substrate 100. According to one embodiment, more than one pair of rows of bonding pads BP may be arranged. The central plating line CPL is disposed between the rows of bonding pads BP, so as to be electrically connected commonly to the rows of bonding pads BP. In other words, the rows of bonding pads BP may be arranged on both sides of the central plating line CPL.

Some of the bonding pads BP may be a bonding pad BP_vdd for supplying power and a bonding pad BP_vss for grounding, and others of the bonding pads BP may be bonding pads for signal transmission. Alternatively, all of the bonding pads BP may be bonding pads for signal transmission. In this case, the bonding pads BP_vdd and BP_vss may be formed on any other region of the base substrate 100 on which the rows of bonding pads BP are not formed.

Referring to FIG. 3D again, the circuit lines CL are extended to the lower surface of the base substrate 100 via the second conductive layer 104. Ball lands BL are respectively formed in end portions of the circuit lines CL extended to the lower surface of the base substrate 100.

Referring to FIGS. 1B and 3E, the photoresist pattern 110 is removed, and a plating mask pattern 125 is formed on the patterned second conductive layer 104. The plating mask pattern 125 includes a first opening portion 125a and a second opening portion 125b through which the bonding pads BP and the central plating line CPL, and the ball lands BL are exposed, respectively.

Next, a first electroplating layer 131 is formed on the second conductive layer 104 exposed in the first opening portion 125a and the second opening portion 125b by using an electroplating method. In other words, the first electroplating layer 131 is formed on the bonding pads BP, the central plating line CPL, and the ball lands BL. During the electroplating, the outer plating line OPL and the central plating line CPL apply current to the bonding pads BP and the ball lands BL.

The plating mask pattern 125 may be a solder resist pattern.

Alternatively, the plating mask pattern 125 may be a photoresist pattern. In this case, a photoresist pattern may be formed on each of the top and bottom surfaces of the base substrate 100. Further, an electroplating layer, formed on the bonding pads BP and the central plating line CPL, and an electroplating layer, formed on the ball lands BL, may be formed of different materials from each other.

Also, if a photoresist pattern is formed as the plating mask pattern 125, a solder resist pattern may be formed after removing the photoresist pattern.

The first electroplating layer 131 may be a finish layer, e.g., a metal finish layer that enables a reliable connection between conductive studs of a semiconductor chip, which is described below, and the bonding pads BP, and may be formed of tin, gold, nickel, or an alloy thereof such that the metal finish layer has a thickness of about 1.5 um or greater to achieve a reliable connection. Also, the metal finish layer may be formed to be about 3 um or greater.

Next, a second electroplating layer 133 may be formed on the first electroplating layer 131. The second electroplating layer 133 may be a solder layer. In detail, the second electroplating layer 133 may be a lead-free solder layer, for example, a tin alloy layer or a pure tin layer. The first and second electroplating layers 131 and 133 may form an intermetallic compound (IMC) with the conductive studs of a semiconductor chip, which is described below.

Referring to FIGS. 1C and 3F, a photoresist layer (not shown) is formed on the first and second electroplating layers 131 and 133 and the plating mask pattern 125. The photoresist layer is then exposed and developed to form a photoresist pattern 150 having a hole 150h exposing the central plating line CPL.

Referring to FIGS. 1D and 3G, the first and second electroplating layers 131 and 133 and the first and second conductive layers 102 and 104 exposed through the hole 150h are removed using a chemical etching method, thereby removing the central plating line CPL The chemical etching method may be a dry etching method or a wet etching method.

By removing the central plating line CPL, the base substrate 100 is exposed in a space between the rows of bonding pads BP, such that the bonding pads BP can be electrically separated from each other. Accordingly, at least with respect to the signal wirings among the circuit lines CL, since an additional wiring branch that functions as an electrically open stub is removed, electrical signals input to the bonding pads BP or output from the bonding pads BP can be transmitted without distortion or noise.

As described above, since the bonding pads BP are arranged in at least one pair of rows that extend in a horizontal direction of the base substrate 100, it facilitates arranging the central plating line CPL between the rows. Accordingly, as compared to a case where the bonding pads BP are irregularly arranged on the whole base substrate 100, the surface area occupied by a plating line is reduced. Also, when all of the bonding pads BP are bonding pads for signal transmission, a bonding pad BP_vdd for supplying power and a bonding pad BP_vss for grounding may be arranged not to be one of the bonding pads BP of the rows. Accordingly, sufficient power can be supplied to a semiconductor device, as described below, and a return path suitable for signals can be provided, thereby improving the performance of a semiconductor device and correcting noise characteristics such as electromagnetic interference (EMI).

Finally, the photoresist pattern 150 is removed to expose the plating mask pattern 125, the bonding pads BP, and the ball lands BL, thereby completing the circuit board 199.

FIGS. 3H through 3I are cross-sectional views sequentially illustrating a method of fabricating a semiconductor package including the circuit board of FIG. 1D, according to an embodiment of the present invention.

Referring to FIG. 3H, a non-conductive paste (NCP) 140 is coated on the exposed bonding pads BP so as to cover the bonding pads BP. The NCP 140 may be formed of a non-conductive material such as an epoxy including a hardener.

Referring to FIG. 3I, a semiconductor chip 200 is disposed on the NCP 140.

Figure 2:
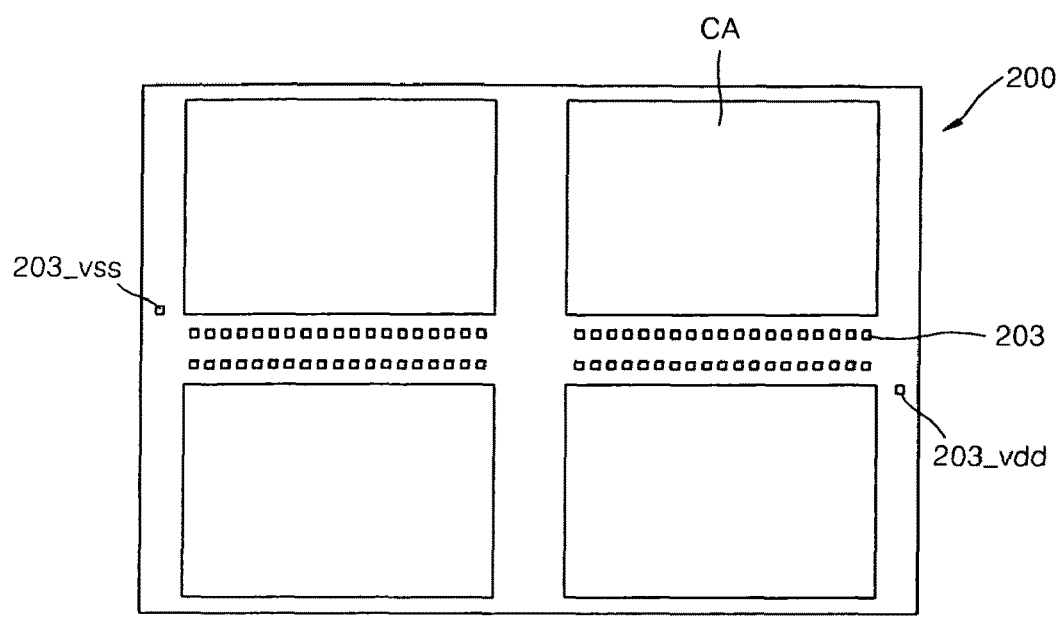
FIG. 2 is a plan view of an upper surface of a semiconductor chip to be attached on the circuit board illustrated in FIG. 1D, according to an embodiment of the present invention.

Referring to FIG. 2, the semiconductor chip 200 includes a plurality of cell array regions (CA) and chip pads 203 arranged in a center peripheral circuit region, between the cell array regions CA, such that the chip pads 203 respectively correspond to the bonding pads BP of the circuit board 199, which is illustrated in FIG. 1D. Likewise, when the chip pads 203 are arranged in the center peripheral circuit region, electrical signals can be quickly input to or output from the cell array regions CA, thereby increasing the operational speed of the semiconductor chip 200.

All of the chip pads 203 may be chip pads for signal transmission, and in this case, a chip pad 203_vdd for power supply corresponding to the bonding pad BP_vdd, and a chip pad 203_vss for ground corresponding to the bonding pad BP_vss, may be additionally arranged.

Referring to FIG. 3I again, a conductive stud 205 is disposed on each of the chip pads 203. The conductive stud 205 may be a gold stud.

Next, the semiconductor chip 200 and the circuit board 199 are pressed together so as to attach the semiconductor chip 200 on the circuit board 199. The conductive studs 205 are respectively arranged on the bonding pads BP, and thus the conductive studs 205 and the bonding pads BP are electrically connected to each other. The bonding pads BP and the conductive studs 205 can be reliably connected by the first and second electroplating layers 131 and 133.

When the semiconductor chip 200 is attached on the circuit board 199, the NCP 140 can be cured or hardened by applying heat. As described above, since the semiconductor chip 200 is attached on the circuit board 199 after coating the NCP 140 on the circuit board 199, an under-filling process of injecting an underfill material in a narrow space between the semiconductor chip 200 and the circuit board 199 after attaching the semiconductor chip 200 on the circuit board 199 is not required.

However, the present invention is not limited thereto, and thus, the semiconductor chip 200 and the circuit board 199 may be attached first, and then an underfill material may be injected in a space therebetween.

Next, a mold layer, or encapsulant, 170 is formed on the semiconductor chip 200. The mold layer 170 may be an epoxy layer. Although not illustrated in the drawing, instead of the mold layer 170, a heat sink may be attached on the semiconductor chip 200 according to the heat characteristics of the semiconductor chip 200.

The semiconductor package 300 is manufactured by respectively forming external connection terminals, or solder balls, 160 on the ball lands BL. Then, the circuit board 199 is cut to be separated into unit semiconductor packages 300. Thus, the outer plating line OPL of FIG. 1A can be removed.

Figure 4A:
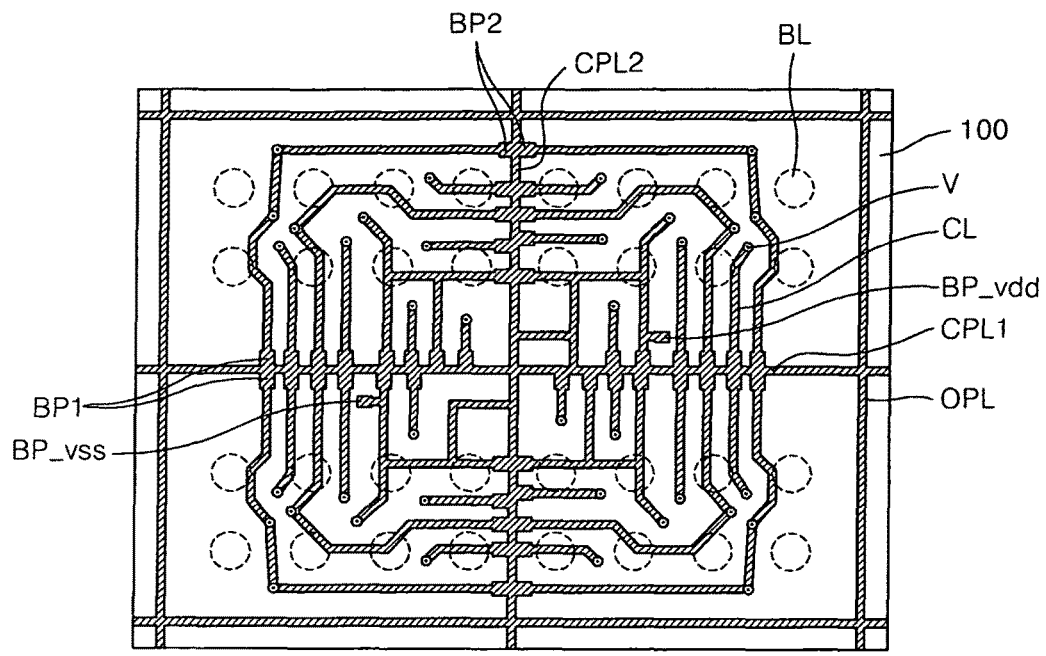
FIGS. 4A and 4B are plan views sequentially illustrating a method of fabricating a circuit board, according to another embodiment of the present invention.
Figure 4B:
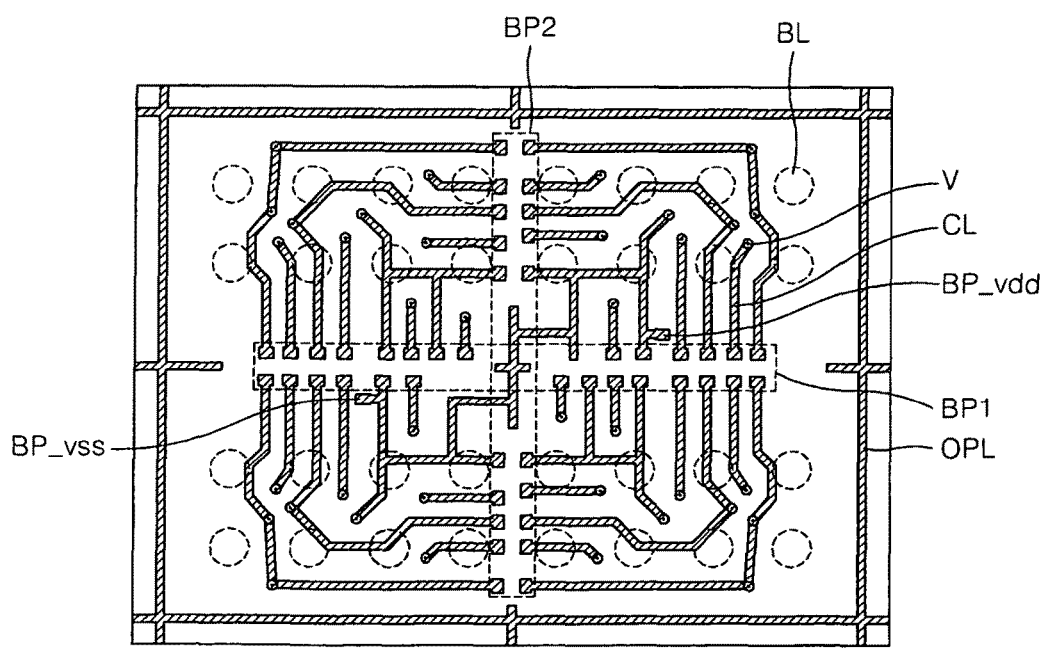
Figure 5:
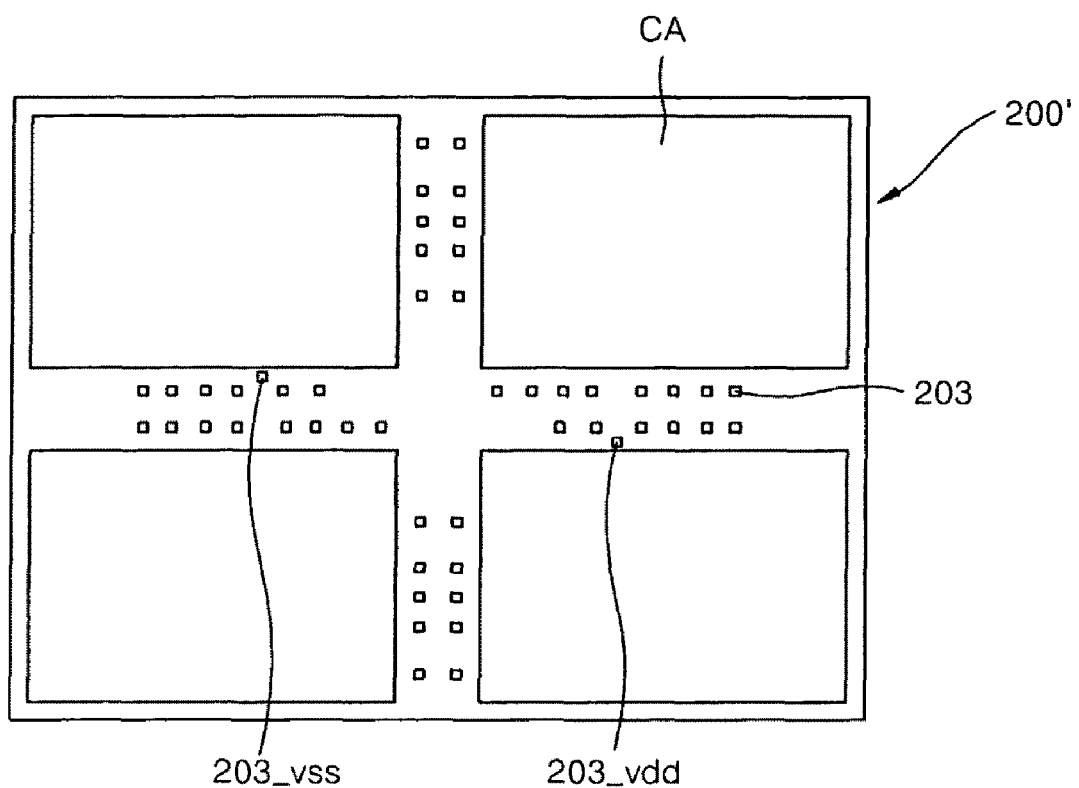
FIG. 5 is a plan view of an upper surface of a semiconductor chip to be attached on the circuit board illustrated in FIG. 4B, according to an embodiment of the present invention.

FIGS. 4A and 4B are plan views sequentially illustrating a method of fabricating a circuit board, according to another embodiment of the present invention. FIG. 5 is a plan view showing an upper surface of a semiconductor chip to be attached on the circuit board of FIG. 4B. The current embodiment is similar to the embodiment described with reference to FIGS. 1A through 1D, 2, and 3A through 3I, except for the following description below.

Referring to FIG. 4A, a pair of rows of first bonding pads BP1 are formed to extend across a top surface of the base substrate 100 in a first direction, e.g., from left to right. Also, a pair of rows of second bonding pads BP2 are formed to extend across the top surface of the base substrate 100 in a second direction, e.g., from top to bottom. Therefore, the first and second directions may be a horizontal direction and a vertical direction, respectively. A first central plating line CPL1 is commonly disposed between the rows of first bonding pads BP1, such that the first central plating line CPL1 can be electrically connected to the rows of first bonding pads BP1. In other words, the rows of first bonding pads BP1 can be arranged on both sides of the first central plating line CPL1 that horizontally extends on the base substrate 100. Also, a second central plating line CPL2 is commonly disposed between the second bonding pads BP2, such that the second central plating line CPL2 can be electrically connected to the rows of second bonding pads BP2. In other words, the rows of second bonding pads BP2 can be arranged on both sides of the second central plating line CPL2 that vertically extends across the base substrate 100. The second bonding pads BP2 can be formed at substantially the same time as the first bonding pads BP1. Also, the second central plating line CPL2 can be formed at substantially the same time as the first central plating line CPL1.

Circuit lines CL are connected to a first side of each of the first and second bonding pads BP1 and BP2. The first central plating line CPL1 is commonly connected to second sides of the first bonding pads BP1, and the second central plating line CPL2 is commonly connected to second sides of the second bonding pads BP2. An outer plating line OPL is connected to the first and second central plating lines CPL1 and CPL2.

The circuit lines CL are extended to the lower surface of the base substrate 100 via a conductive layer formed on inner sidewalls of the via hole V. In one aspect, the circuit lines CL are bent at a right angle to the lower surface of the base substrate 100. Ball lands BL are respectively formed at an end of the circuit lines CL that are extended to the lower surface of the base substrate 100.

The first and second bonding pads BP1 and BP2 may be bonding pads for signal transmission. In this case, a bonding pad BP_vdd for supplying power and a bonding pad BP_vss for grounding may be arranged not to be one of the first and second bonding pads BP1 and BP2 but on any other region of the base substrate 100 on which the first and second bonding pads BP1 and BP2 are not located.

An electroplating layer (not shown) is formed on the first and second bonding pads BP1 and BP2, the central plating lines CPL1 and CPL2, and the ball lands BL by using an electroplating method. During this process, the outer plating line OPL and the central plating lines CPL1 and CPL2 apply current to the first and second bonding pads BP1 and BP2 and the ball lands BL.

Referring to FIG. 4B, the central plating lines CPL1 and CPL2 are removed. Consequently, the first and second bonding pads BP1 and BP2 can be electrically separated from each other, and the base substrate 100 is exposed in a space between the rows of first bonding pads BP1 and second bonding pads BP2.

FIG. 5 is a plan view illustrating an upper surface of a semiconductor chip that can be mounted on the circuit board of FIG. 4B. The semiconductor chip 200' includes a plurality of cell array regions CA, and a plurality of chip pads 203 arranged in a center peripheral circuit region between the cell array regions CA. The chip pads 203 are arranged to face the first and second bonding pads BP1 and BP2 and respectively connect with the first and second bonding pads BP1 and BP2 of the circuit board. That is, the chip pads 203 are also arranged in first rows horizontally extending across the center peripheral circuit area between the cell array regions CA, and in second rows vertically extending across the center peripheral circuit area between the cell array regions CA. The chip pads 203 include chip pads for signal transmission. In this case, a chip pad 203_vdd for supplying power and corresponding to the bonding pad BP_vdd, and a chip pad 203_vss for grounding and corresponding to the bonding pad BP_vss for grounding may be additionally arranged.

In the above-described embodiments of the present invention, a circuit board having two wiring layers has been described; however, the present invention can also be applied to a circuit board having four or more wiring layers.

As described above, according to some embodiments of the present invention, at least one pair of rows of bonding pads, and a central plating line between the rows of first bonding pads and electrically connecting to the rows of first bonding pads are formed on a base substrate, and an electroplating layer is formed on the first bonding pads by applying current via the central plating line to the bonding pads BP. Thus, a reliable connection between conductive studs of a semiconductor chip and the bonding pads can be achieved, respectively. Next, by removing the central plating lines, the distortion of signals from being transmitted to the bonding pads can be prevented, an excellent electrical signal transmission can be obtained, and the effects of noise on the bonding pads can be reduced.

According to an aspect of the present invention, there is provided a method of fabricating a circuit board. At least one pair of rows of first bonding pads arranged in a first direction and a first central plating line formed between the rows of first bonding pads to electrically connect to the rows of first bonding pads are formed on a base substrate. An electroplating layer on the first bonding pads is formed. The base substrate is exposed by removing the first central plating line.

According to another aspect of the present invention, there is provided a method of fabricating a semiconductor package. At least one pair of rows of first bonding pads arranged in a first direction and a first central plating line formed between the rows of first bonding pads to electrically connect to the rows of first bonding pads are formed on a base substrate, and an electroplating layer on the first bonding pads is formed, and the base substrate is exposed by removing the first central plating line, thereby a circuit board is formed. A semiconductor chip including chip pads respectively corresponding to the first bonding pads, and each with a conductive stud is provided. The conductive studs electrically connect with the first bonding pads by attaching the semiconductor chip and the circuit board.

According to another aspect of the present invention, there is provided a circuit board. The circuit board comprises a base substrate. At least one pair of rows of first bonding pads are arranged on the base substrate in a first direction. The base substrate is exposed in a space between the rows of first bonding pads.

According to another aspect of the present invention, there is provided a semiconductor package. The semiconductor package comprises a circuit board having a base substrate, and at least one pair of rows of first bonding pads arranged on the base substrate in a first direction. The base substrate is exposed in a space between the rows of first bonding pad rows. A semiconductor chip is provided on the circuit board. The semiconductor chip comprises chip pads respectively corresponding to the first bonding pads and each with a conductive stud to electrically connect with each of the first bonding pads.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of fabricating a circuit board, the method comprising:
    forming at least one pair of rows of first bonding pads on a base substrate in a first direction;
    at the same time as forming the at least one pair of rows of first bonding pads, forming a first central plating line between the rows of first bonding pads such that the first central plating line is electrically connected to the rows of first bonding pads;
    forming an electroplating layer on the first bonding pads and the first central plating line; and
    removing the first central plating line and the electroplating layer formed on the first central plating line, thereby exposing a portion of the base substrate.

2. The method of claim 1, further comprising:
    forming at least one pair of rows of second bonding pads on the base substrate in a second direction; and
    at the same time as forming the at least one pair of rows of second bonding pads, forming a second central plating line between the rows of second bonding pads such that the second central plating line is electrically connected to the rows of second bonding pads.

3. The method of claim 2, wherein second bonding pads and the second central plating line are formed at the same time as the first bonding pads and the first central plating line.

4. The method of claim 1, wherein the first bonding pads comprise bonding pads for signal transmission, and the method further comprises forming a bonding pad for supplying power and a bonding pad for grounding such that the bonding pads for supplying power and grounding are disposed on a different region of the substrate than the first bonding pads.

5. The method of claim 1, wherein removing the first central plating line comprises using a chemical etching method.

6. The method of claim 1, wherein, before forming the electroplating layer, a plating mask pattern exposing the first bonding pads and the first central plating line is formed, and the electroplating layer is formed on the first bonding pads and the first central plating line exposed by the plating mask pattern.

7. The method of claim 1, wherein the electroplating layer comprises a finish layer and a solder layer that are sequentially stacked.

8. The method of claim 1, further comprising forming ball lands on a lower surface of the base substrate.

9. The method of claim 8, wherein forming the first bonding pads, the first central plating line, and the ball lands comprises:
    forming first conductive layers on an upper surface and the lower surface of the base substrate;
    forming a via hole in the first conductive layers and the base substrate;
    forming a second conductive layer on the first conductive layers and sidewalls of the via hole;
    forming a photoresist pattern on the second conductive layer; and
    etching the second conductive layer and the first conductive layers using the photoresist pattern as an etch mask.

10. The method of claim 9, further comprising:
    removing the photoresist pattern; and
    forming a plating mask pattern on the base substrate and the second conductive pattern, the plating mask pattern defining a first opening exposing the first bonding pads and the first central plating line and a second opening exposing the ball lands.

11. A method of fabricating a semiconductor package, the method comprising:
    forming a circuit board, including:
        forming at least one pair of rows of first bonding pads arranged on a base substrate in a first direction, forming together with the at least one pair of rows of first bonding pads a first central plating line between the rows of first bonding pads so as to electrically connect the first central plating line to the rows of first bonding pads, wherein the at least one pair of rows of first bonding pads and the first central plating line are formed of the same material and at the same vertical level within the semiconductor package, forming an electroplating layer on the first bonding pads and the first central plating line, and removing the first central plating line and the electroplating layer formed on the first central plating line, thereby exposing a portion of the base substrate;

providing a semiconductor chip including chip pads respectively corresponding to the first bonding pads, wherein each of the chip pads includes a conductive stud; and electrically connecting the conductive studs to the first bonding pads by attaching the semiconductor chip to the circuit board.

12. The method of claim 11, further comprising coating a non-conductive paste (NCP) covering the first bonding pads on the circuit board before attaching the semiconductor chip to the circuit board.

13. The method of claim 12, wherein the NCP is cured at the same time as the semiconductor chip and the circuit board are attached.

14. The method of claim 11, which further comprises, forming at least one pair of rows of second bonding pads that are arranged on the base substrate in a second direction; and forming, together with the at least one pair of rows of second bonding pads a second central plating line between the rows of second bonding pads so as to electrically connect the second central plating line to the rows of second bonding pads, wherein the at least one pair of rows of second bonding pads and the second central plating line are formed of the same material and at the same vertical level within the semiconductor package.

15. The method of claim 11, further comprising, before forming the electroplating layer, forming a plating mask pattern exposing the first bonding pads and the first central plating line, wherein the electroplating layer is formed on the first bonding pads and the first central plating line exposed through the plating mask pattern.

16. The method of claim 11, wherein the electroplating layer comprises a finish layer and a solder layer that are sequentially stacked.

17. The method of claim 11, further comprising forming ball lands on a lower surface of the base substrate.

18. The method of claim 17, wherein forming the first bonding pads, the first central plating line, and the ball lands comprises:

forming first conductive layers on an upper, surface and the lower surface of the base substrate;

forming a via hole in the first conductive layers and the base substrate;

forming a second conductive layer on the first conductive layers and sidewalls of the via hole;

forming a photoresist pattern on the second conductive layer; and etching the second conductive layer and the first conductive layers using the photoresist pattern as an etch mask.

19. The method of claim 18, further comprising:

removing the photoresist pattern; and forming a plating mask pattern on the base substrate and the second conductive pattern, the plating mask pattern defining a first opening exposing the first bonding pads and the first central plating line and a second opening exposing the ball lands.

20. The method of claim 19, further comprising:

forming external connection terminals on the ball lands; and forming an encapsulant on the semiconductor chip and the plating mask pattern.

* * * * *